US012604768B2

(12) United States Patent
Yim et al.

(10) Patent No.: US 12,604,768 B2
(45) Date of Patent: Apr. 14, 2026

(54) SEMICONDUCTOR PACKAGE AND METHOD OF FABRICATING THE SAME

(71) Applicant: Samsung Electronics Co., Ltd., Suwon-si (KR)

(72) Inventors: Choong Bin Yim, Seoul (KR); Ji Hwang Kim, Cheonan-si (KR); Jin-Woo Park, Seoul (KR); Jong Bo Shim, Anyang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 665 days.

(21) Appl. No.: 17/961,954

(22) Filed: Oct. 7, 2022

(65) Prior Publication Data

US 2023/0111343 A1     Apr. 13, 2023

(30) Foreign Application Priority Data

Oct. 13, 2021     (KR) ........................ 10-2021-0135794

(51) Int. Cl.
| | |
|---|---|
| *H01L 25/10* | (2006.01) |
| *H01L 21/56* | (2006.01) |
| *H01L 23/00* | (2006.01) |
| *H01L 23/538* | (2006.01) |
| *H01L 25/00* | (2006.01) |
| *H01L 21/304* | (2006.01) |

(52) U.S. Cl.
CPC ............ *H01L 25/105* (2013.01); *H01L 21/56* (2013.01); *H01L 23/5389* (2013.01); *H01L 24/19* (2013.01); *H01L 24/20* (2013.01); *H01L 25/50* (2013.01); *H01L 21/304* (2013.01); *H01L 24/08* (2013.01); *H01L 24/13* (2013.01); *H01L 24/16* (2013.01); *H01L 2224/08225* (2013.01); *H01L 2224/13082* (2013.01); *H01L 2224/13109* (2013.01); *H01L 2224/13111* (2013.01);

(Continued)

(58) Field of Classification Search
CPC . H01L 2224/13111; H01L 2224/13113; H01L 2224/13116
See application file for complete search history.

(56) References Cited

U.S. PATENT DOCUMENTS

| | | |
|---|---|---|
| 8,877,554 B2 | 11/2014 | Tsai et al. |
| 9,691,707 B2 | 6/2017 | Chi et al. |

(Continued)

FOREIGN PATENT DOCUMENTS

| | | |
|---|---|---|
| CN | 112038329 A | 12/2020 |
| KR | 10-2012-0088365 A | 8/2012 |

(Continued)

OTHER PUBLICATIONS

Korean Office Action dated Jul. 2, 2025, issued in corresponding Korean Patent Application No. 10-2021-0135794.

*Primary Examiner* — Thao P Le
(74) *Attorney, Agent, or Firm* — Harness, Dickey & Pierce, P.L.C.

(57) ABSTRACT

A semiconductor package includes a first wiring structure which includes a first insulating layer, and a first wiring pad inside the first insulating layer, a first semiconductor chip on the first wiring structure, a second wiring structure on the first semiconductor chip, and a connecting member between the first wiring structure and the second wiring structure. The second wiring structure includes a second insulating layer and a plurality of second wiring pads in the second insulating layer which each directly contact one surface of the first semiconductor chip.

20 Claims, 13 Drawing Sheets

(52) U.S. Cl.
CPC ............... *H01L 2224/13113* (2013.01); *H01L 2224/13116* (2013.01); *H01L 2224/13118* (2013.01); *H01L 2224/1312* (2013.01); *H01L 2224/13139* (2013.01); *H01L 2224/13144* (2013.01); *H01L 2224/13147* (2013.01); *H01L 2224/13155* (2013.01); *H01L 2224/13157* (2013.01); *H01L 2224/13164* (2013.01); *H01L 2224/13169* (2013.01); *H01L 2224/16225* (2013.01); *H01L 2224/19* (2013.01); *H01L 2224/211* (2013.01); *H01L 2224/215* (2013.01); *H01L 2225/1035* (2013.01); *H01L 2225/1041* (2013.01); *H01L 2924/01013* (2013.01); *H01L 2924/01022* (2013.01); *H01L 2924/01028* (2013.01); *H01L 2924/01029* (2013.01); *H01L 2924/01047* (2013.01); *H01L 2924/0105* (2013.01); *H01L 2924/01079* (2013.01); *H01L 2924/01082* (2013.01)

(56)        References Cited

U.S. PATENT DOCUMENTS

| | | | | |
|---|---|---|---|---|
| 10,304,817 | B2 | 5/2019 | Lin et al. | |
| 10,515,936 | B1 * | 12/2019 | Chang Chien | ........ H01L 21/568 |
| 10,679,930 | B2 * | 6/2020 | Lee | ........ H01L 23/488 |
| 11,676,904 | B2 * | 6/2023 | Shin | ........ H01L 24/48 |
| | | | | 257/777 |
| 12,170,259 | B2 * | 12/2024 | Seo | ........ H01L 24/03 |
| 2020/0105544 | A1 * | 4/2020 | Tsai | ........ H01L 23/5226 |
| 2020/0411444 | A1 * | 12/2020 | Tsai | ........ H01L 21/6835 |
| 2022/0208629 | A1 * | 6/2022 | Jeong | ........ H01L 23/3121 |
| 2023/0047026 | A1 * | 2/2023 | Ha | ........ H01L 25/162 |
| 2023/0068587 | A1 * | 3/2023 | Yoon | ........ H01L 23/49822 |
| 2023/0076184 | A1 * | 3/2023 | Shim | ........ H01L 25/0657 |
| 2023/0111343 | A1 * | 4/2023 | Yim | ........ H01L 24/19 |
| | | | | 257/737 |
| 2023/0275014 | A1 * | 8/2023 | Yu | ........ H01L 25/18 |
| | | | | 257/777 |
| 2023/0335476 | A1 * | 10/2023 | Lee | ........ H01L 24/48 |
| 2024/0032310 | A1 * | 1/2024 | Mun | ........ H01L 23/5386 |
| 2024/0055338 | A1 * | 2/2024 | Kim | ........ H01L 23/49827 |
| 2024/0258242 | A1 * | 8/2024 | Park | ........ H01L 25/105 |
| 2025/0096179 | A1 * | 3/2025 | Kim | ........ H01L 23/3128 |

FOREIGN PATENT DOCUMENTS

| | | |
|---|---|---|
| KR | 10-2019-0096562 A | 8/2019 |
| KR | 10-2021-0026539 A | 3/2021 |

* cited by examiner

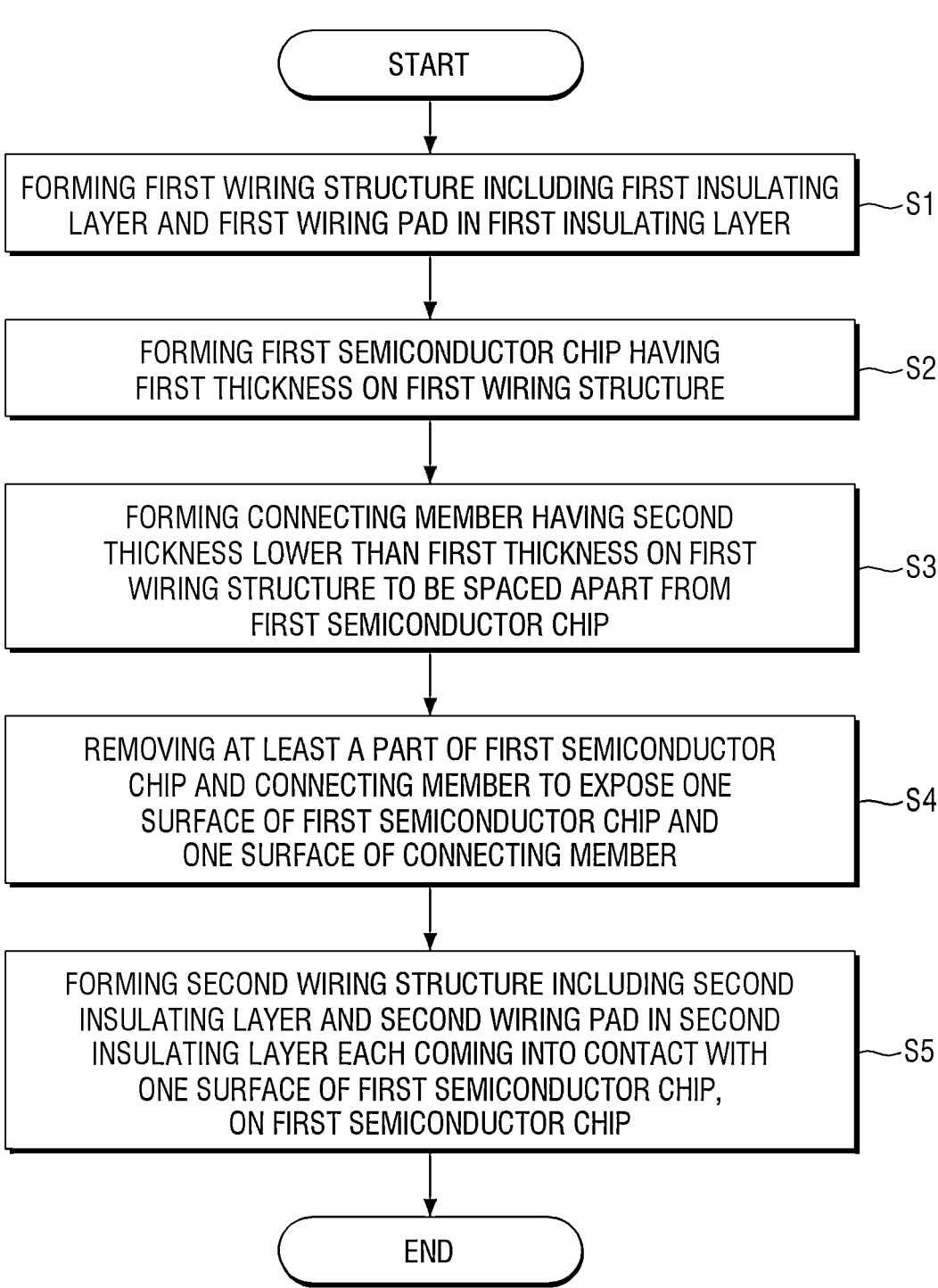

START

FORMING FIRST WIRING STRUCTURE INCLUDING FIRST INSULATING LAYER AND FIRST WIRING PAD IN FIRST INSULATING LAYER　—S1

FORMING FIRST SEMICONDUCTOR CHIP HAVING FIRST THICKNESS ON FIRST WIRING STRUCTURE　—S2

FORMING CONNECTING MEMBER HAVING SECOND THICKNESS LOWER THAN FIRST THICKNESS ON FIRST WIRING STRUCTURE TO BE SPACED APART FROM FIRST SEMICONDUCTOR CHIP　—S3

REMOVING AT LEAST A PART OF FIRST SEMICONDUCTOR CHIP AND CONNECTING MEMBER TO EXPOSE ONE SURFACE OF FIRST SEMICONDUCTOR CHIP AND ONE SURFACE OF CONNECTING MEMBER　—S4

FORMING SECOND WIRING STRUCTURE INCLUDING SECOND INSULATING LAYER AND SECOND WIRING PAD IN SECOND INSULATING LAYER EACH COMING INTO CONTACT WITH ONE SURFACE OF FIRST SEMICONDUCTOR CHIP, ON FIRST SEMICONDUCTOR CHIP　—S5

END

SEMICONDUCTOR PACKAGE AND METHOD OF FABRICATING THE SAME

CROSS-REFERENCE TO RELATED APPLICATION

This application claims priority from Korean Patent Application No. 10-2021-0135794 filed on Oct. 13, 2021 in the Korean Intellectual Property Office, and all the benefits accruing therefrom under 35 U.S.C. 119, the contents of which in its entirety are herein incorporated by reference.

BACKGROUND

1. Technical Field

The present inventive concepts relate to semiconductor packages and methods of fabricating the same.

2. Description of the Related Art

Due to development of an electronic industry, there are increasing demands for higher functionality, higher speed and miniaturization of electronic components. In response to such a tendency, a method of stacking and mounting a plurality of semiconductor chips on a single wiring structure for package or a method of stacking a package on the package may be used. For example, a package-in-package (PIP) type semiconductor package or a package-on-package (POP) type semiconductor package may be used.

The POP type semiconductor package may include an interposer for electrically connecting the packages between an upper package and a lower package. The interposer may facilitate the connection between the upper package and the lower package and prevent warpage between the upper package and the lower package.

SUMMARY

Aspects of the present inventive concepts provide a semiconductor package having improved product reliability, by placing a wiring structure on a semiconductor chip so that the wiring structure is in direct contact with the semiconductor chip.

Aspects of the present inventive concepts also provide a method of fabricating a semiconductor package having improved process characteristics, by placing a wiring structure on a semiconductor chip so that the wiring structure is in direct contact with the semiconductor chip.

According to some example embodiments of the present inventive concepts, a semiconductor package may include a first wiring structure which includes a first insulating layer and a first wiring pad inside the first insulating layer, a first semiconductor chip on the first wiring structure, a second wiring structure on the first semiconductor chip, wherein the second wiring structure includes a second insulating layer and a plurality of second wiring pads in the second insulating layer, wherein the second insulating layer and the plurality of second wiring pads each directly contact one surface of the first semiconductor chip, and a connecting member which is between the first wiring structure and the second wiring structure.

According to some example embodiments of the present inventive concepts, a semiconductor package may include a first wiring structure which includes a first insulating layer and a first wiring pad inside the first insulating layer, a first semiconductor chip on the first wiring structure, a second wiring structure on the first semiconductor chip, wherein the second wiring structure includes a second insulating layer and a plurality of second wiring pads in the second insulating layer which each directly contact one surface of the first semiconductor chip, a connecting member placed between the first and second wiring structures, and a mold layer which covers the first semiconductor chip, wherein one surface of the first semiconductor chip is isolated from direct contact with the mold layer.

According to some example embodiments of the present inventive concepts, a method of fabricating a semiconductor package may include forming a first wiring structure that includes a first insulating layer and a first wiring pad inside the first insulating layer, forming a first semiconductor chip having a first thickness on the first wiring structure, forming a connecting member having a second thickness lower than the first thickness on the first wiring structure such that the connecting member is isolated from direct contact with, removing at least a part of the first semiconductor chip and the connecting member to expose one surface of the first semiconductor chip and one surface of the connecting member, and forming a second wiring structure on the first semiconductor chip, the second wiring structure including a second insulating layer and a plurality of second wiring pads inside the second insulating layer, the second insulating layer and the plurality of second wiring pads each directly contacting the one surface of the first semiconductor chip.

However, aspects of the present inventive concepts are not restricted to the aspects set forth herein. The above and other aspects of the present inventive concepts will become more apparent to one of ordinary skill in the art to which the present inventive concepts pertain by referencing the detailed description of the present inventive concepts given below.

BRIEF DESCRIPTION OF THE DRAWINGS

The above and other aspects and features of the present inventive concepts will become more apparent by describing in detail example embodiments thereof with reference to the attached drawings, in which:

FIG. 5 is a schematic cross-sectional view of the semiconductor package according to some example embodiments taken along I-I' of FIG. 4;

FIGS. 7, 8, 9, 10, 11, and 12 are diagrams for explaining a method of fabricating a semiconductor package according to some example embodiments of the present inventive concepts;

FIG. 13 is a flowchart for explaining the method of fabricating the semiconductor package according to some example embodiments.

DETAILED DESCRIPTION

Figure 1:
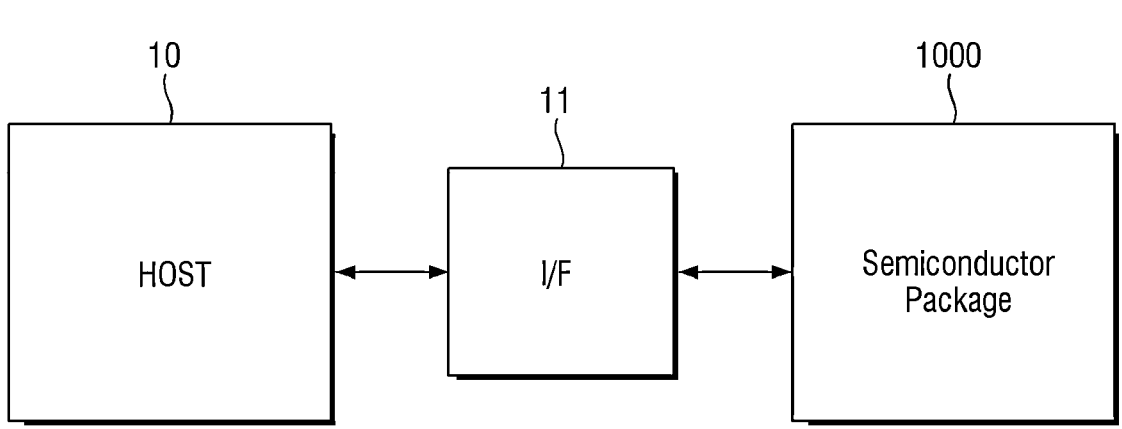
FIGS. 1 and 2 are diagrams of an electronic device according to some example embodiments.

Hereinafter, some example embodiments of the present inventive concepts will be described in detail so that a person skilled in the art would understand the same. The inventive concepts may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present such that the element and the other element are isolated from direct contact with each other by one or more interposing spaces and/or structures. In contrast, when an element is referred to as being "directly on" another element, there are no intervening elements present such that the element and the other element are in direct contact with each other. As described herein, an element that is "on" another element may be above, beneath, and/or horizontally adjacent to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being the "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Hereinafter, a semiconductor package according to some example embodiments will be described referring to FIGS. 1 to 5.

Figure 2:
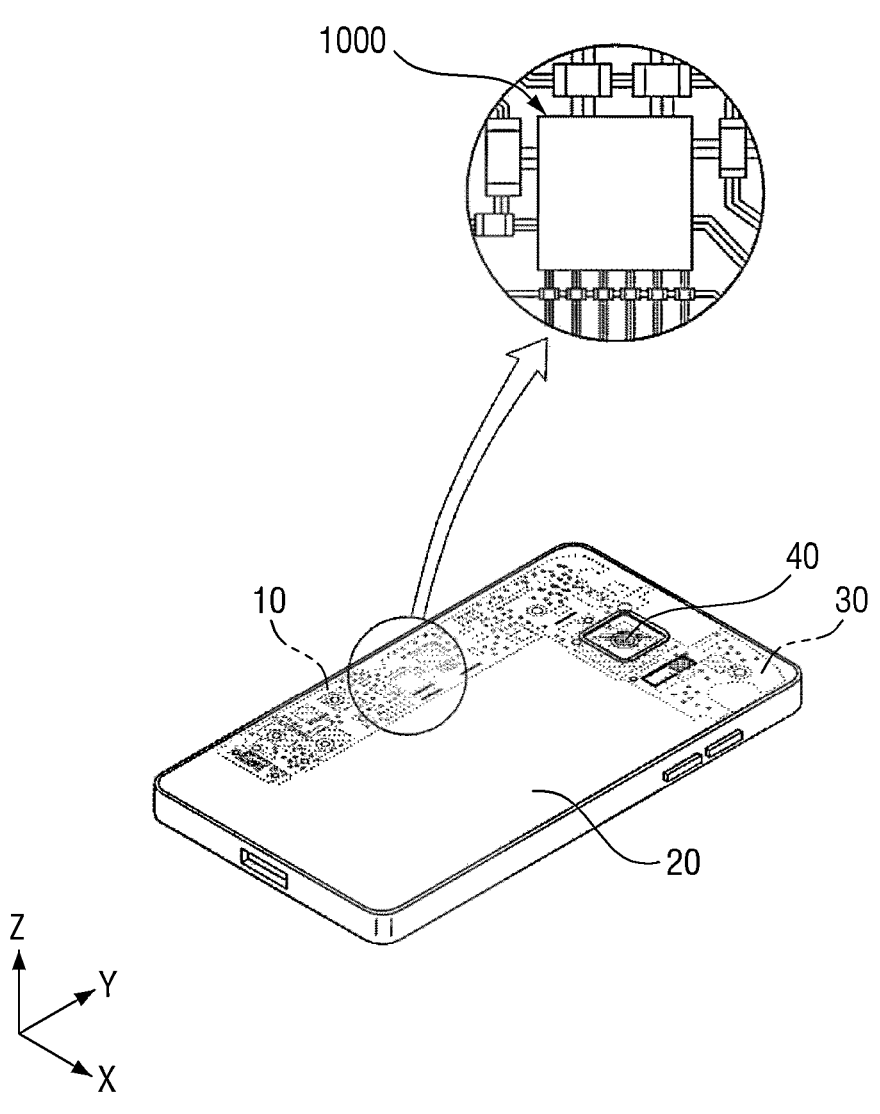
Figure 3:
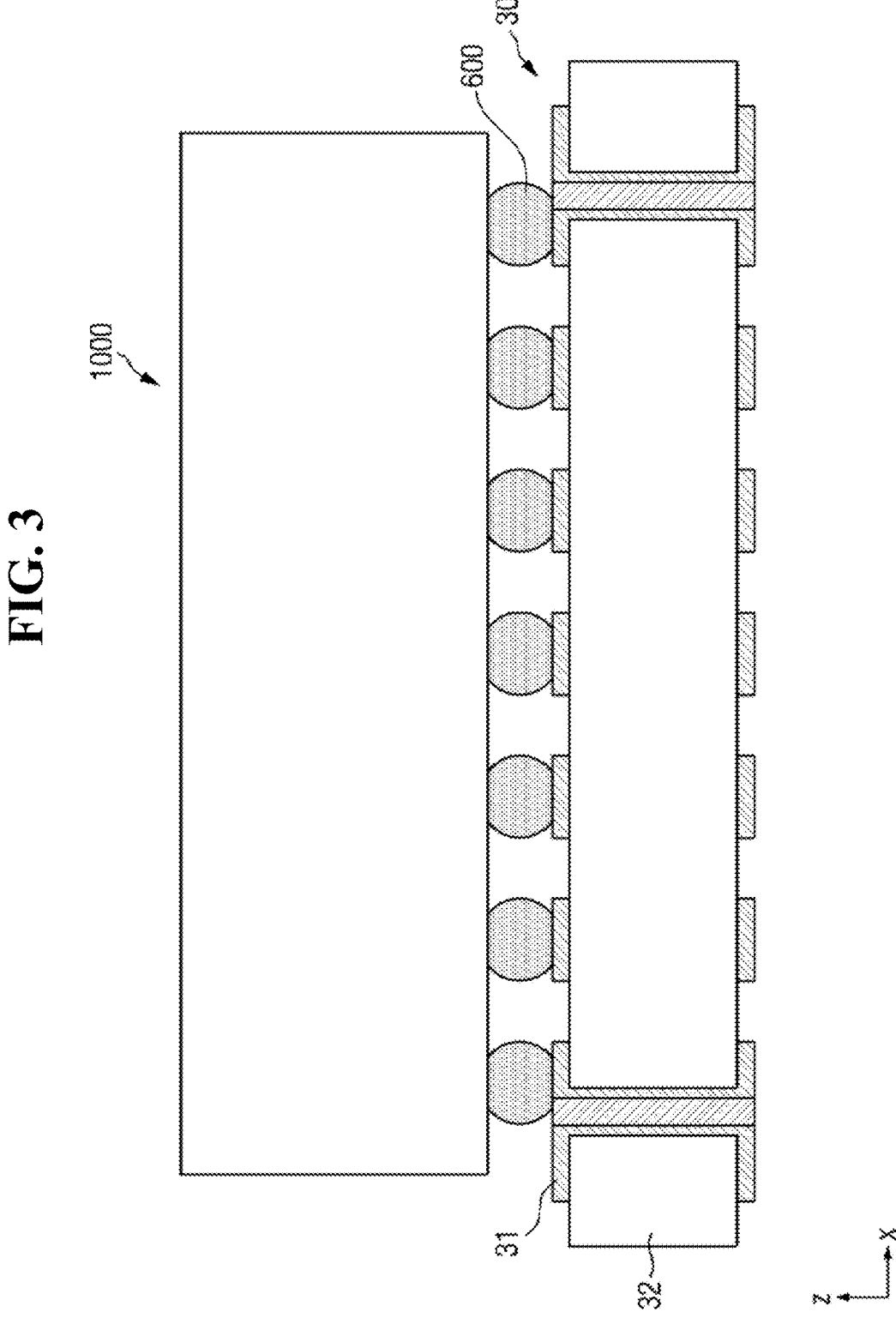
FIG. 3 is a diagram of a semiconductor package and a main board of FIG. 2 according to some example embodiments.
Figure 4:
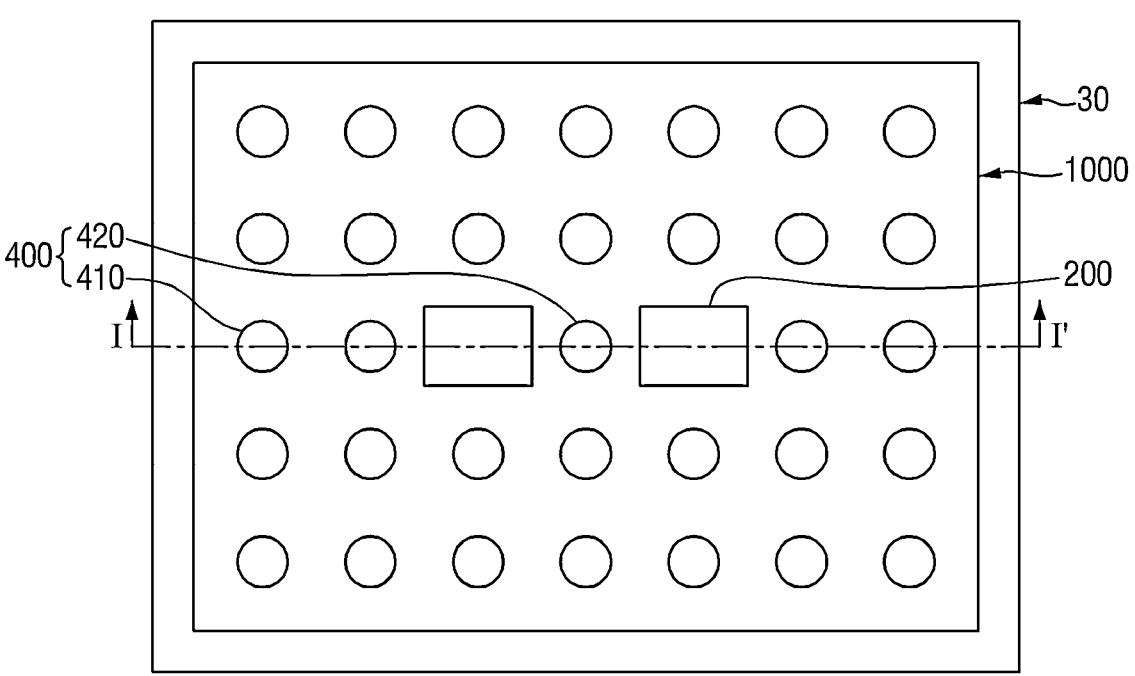
FIG. 4 is an example layout diagram of the semiconductor package according to some example embodiments of FIG. 3.
Figure 5:
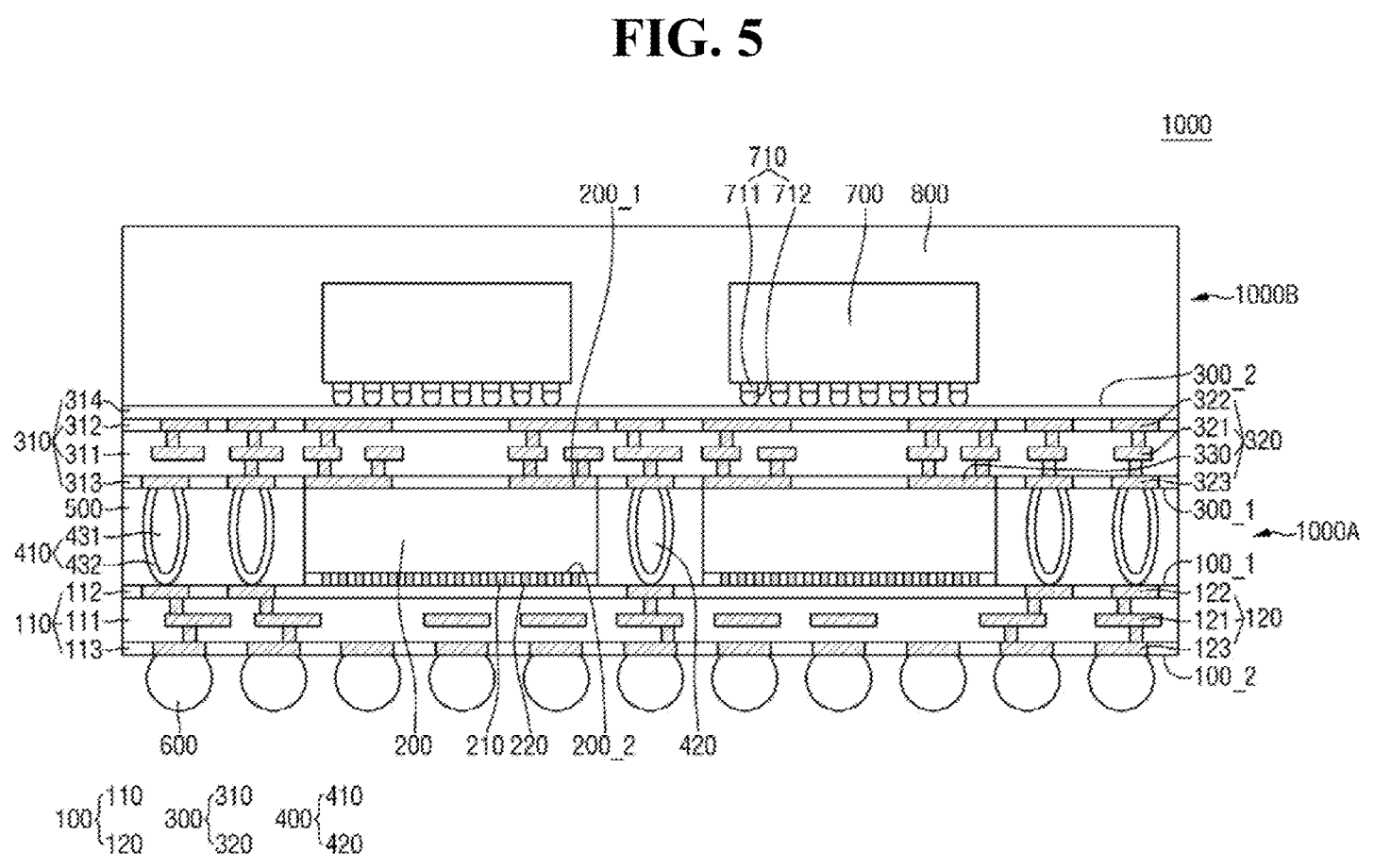

FIGS. 1 and 2 are diagrams for explaining an electronic device according to some example embodiments. FIG. 3 is a diagram for explaining a semiconductor package and a main board of FIG. 2. FIG. 4 is an example layout diagram of the semiconductor package according to some example embodiments of FIG. 3. FIG. 5 is a schematic cross-sectional view of the semiconductor package according to some example embodiments taken along I-I' of FIG. 4.

Referring to FIG. 1, the electronic device 1 may include a host 10, an interface 11, and a semiconductor package 1000.

In some example embodiments, the host 10 may be connected to the semiconductor package 1000 through the interface 11. For example, the host 10 may transmit a signal to the semiconductor package 1000 to control the semiconductor package 1000. Further, for example, the host 10 may receive the signal from the semiconductor package 1000 and process the data included in the signal.

For example, the host 10 may include a central processing unit (CPU), a controller, an application specific integrated circuit (ASIC), and the like. Further, for example, the host 10 may include a memory chip, such as a DRAM (Dynamic Random Access Memory), a SRAM (Static RAM), PRAM (Phase-change RAM), a MRAM (Magneto resistive RAM), a FeRAM (Ferroelectric RAM) and a RRAM (Resistive RAM).

Referring to FIGS. 1 and 2, the electronic device 1 may include a host 10, a body 20, a main board 30, a camera module 40 (e.g., a camera), and a semiconductor package 1000.

The main board 30 may be mounted inside the body 20 of the electronic device 1. The host 10, the camera module 40, and the semiconductor package 1000 may be mounted on the main board 30. The host 10, the camera module 40, and the semiconductor package 1000 may be electrically connected by the main board 30. For example, the interface 11

(e.g., a wired or wireless communication transceiver) may be implemented by the main board 30.

The host 10 and the semiconductor package 1000 may be electrically connected by the main board 30 to transmit and receive signals.

Referring to FIG. 3, the semiconductor package 1000 may be placed on the main board 30. For example, a connecting structure 600 may be placed on the main board 30. The main board 30 may be connected to the semiconductor package 1000 by the connecting structure 600.

The main board 30 may be a printed circuit wiring structure (printed circuit board; PCB), a ceramic wiring structure, a glass wiring structure, an interposer wiring structure, or the like. However, the inventive concepts are not limited thereto. For convenience of explanation, the description will be provided on the assumption that the main board 30 is a printed circuit wiring structure.

The main board 30 may include a connecting structure 31 and a core 32. The core 32 may include a CCL (Copper Clad Laminate), a PPG (Prepreg), an ABF (Ajinomoto Build-up Film), epoxy, polyimide, and the like. The connecting structure 31 may include, but is not limited to, at least one of copper (Cu), aluminum (Al), silver (Ag), tin (Sn), gold (Au), nickel (Ni), lead (Pb), titanium (Ti), and alloys thereof The core 32 is placed at a central part of the main board 30, and the connecting structure 31 may be placed above and below the core 32. The connecting structure 31 may be placed to be exposed above and below the main board 30.

Further, the connecting structure 31 may be placed to penetrate the core 32. The connecting structure 31 may electrically connect elements that come into contact with (e.g., directly contact) the main board 30. For example, the connecting structure 31 may electrically connect the semiconductor package 1000 and the host 10. That is, the connecting structure 31 may electrically connect the semiconductor package 1000 and the host 10 through the connecting structure 600.

Referring to FIG. 5, the semiconductor package according to some example embodiments includes a first semiconductor package 1000A that includes a first wiring structure 100, a first semiconductor chip 200, a second wiring structure 300, a connecting member 400, and a first mold layer 500.

The first wiring structure 100 may be a wiring structure for package. For example, the first wiring structure 100 may be a printed circuit wiring structure (PCB; printed circuit board), a ceramic wiring structure, or the like. The first wiring structure 100 may be a wiring structure for a wafer level package (WLP) fabricated at a wafer level. The first wiring structure 100 may include one surface 100_1 and the other surface 100_2 that are opposite to each other.

The first wiring structure includes a first insulating layer 110 and a first wiring pad 120. The first insulating layer 110 may include a first substrate 111, a first upper passivation film 112, and a first lower passivation film 113. The first wiring pad 120 may include a first wiring pattern 121, a first upper pad 122, and a first lower pad 123.

The first substrate 111 may be, for example, a printed circuit board (PCB) or a ceramic substrate. However, the technical idea of the present inventive concepts is not limited thereto.

When the first substrate 111 is a printed circuit board, the first substrate 111 may be made up of at least one material selected from phenol resin, epoxy resin, and polyimide. The first substrate 111 may include at least one material selected from tetrafunctional epoxy, polyphenylene ether, epoxy/polyphenylene oxide, BT (bismaleimide triazine), thermount, cyanate ester, and liquid crystal polymer.

The first substrate 111 may include a resin impregnated in a core material such as glass fiber (glass cloth, glass fabric) together with an inorganic filler, for example, Prepreg, ABF (Ajinomoto Build-up Film) or FR-4, BT (Bismaleimide Triazine).

The surface of the first substrate 111 may be covered with a solder resist. That is, the first upper passivation film 112 and the first lower passivation film 113 formed on the surface of the first substrate 111 may be solder resists. The first upper passivation film 112 and the first lower passivation film 113 may include, for example, a photoimageable dielectric (PID). However, the technical idea of the present inventive concepts is not limited thereto.

The first wiring pad 120 may be placed inside the first insulating layer 110. The first wiring pad 120 may be made up of a first wiring pattern 121 for electrically connecting the first lower pad 123 and the first upper pad 122. The first wiring pattern 121 may include a plurality of wiring vias that connect the plurality of first lower pads 123 and the first upper pads 122.

The first wiring pad 120 may include, but is not limited to, at least one of copper (Cu), aluminum (Al), silver (Ag), tin (Sn), gold (Au), nickel (Ni), lead (Pb), titanium (Ti) or alloys thereof.

Although the first insulating layer 110 is shown as three layers, this is only for convenience of explanation. For example, it goes without saying that the first insulating layer 110 may be made up of multiple layers more than five layers to form the first wiring pad 120 of multiple layers.

In some example embodiments, the connecting structure 600 may be formed on the other surface 100_2 of the first wiring structure 100. The connecting structure 600 may be attached to the first lower pad 123.

The connecting structure 600 may have, for example, but is not limited to, a spherical shape or elliptical spherical shape. Although the connecting structure 600 may include, for example, at least one of tin (Sn), indium (In), lead (Pb), zinc (Zn), nickel (Ni), gold (Au), silver (Ag), copper (Cu), antimony (Sb), bismuth (Bi), and combinations thereof, the technical idea of the present inventive concepts is not limited thereto.

The connecting structure 600 may electrically connect the first wiring structure 100 to an external device. Accordingly, the connecting structure 600 may provide an electric signal to the first wiring structure 100, or may provide an electric signal, which is provided from the first wiring structure 100, to an external device.

The first upper passivation film 112 and the first upper pad 122 may be formed on the upper surface of the first substrate 111. The first upper pad 122 may be placed between the first upper passivation film 112 and the first substrate 111. Although the first upper passivation film 112 may be formed on the first substrate 111 and expose the first upper pad 122.

The first lower passivation film 113 and the first lower pad 123 may be formed on the lower surface of the first substrate 111. The first lower pad 123 may be placed between the first lower passivation film 113 and the first substrate 111. The first lower passivation film 113 may be formed on the first substrate 111 and expose the first lower pad 123.

The first semiconductor chip 200 may be placed on the first wiring structure 100. For example, the first semiconductor chip 200 may be mounted on one surface 100_1 (e.g., first surface) of the first wiring structure 100. The first semiconductor chip 200 may include an integrated circuit (IC) in which hundreds to millions of or more semiconductor elements are integrated in a single chip. For example, the first semiconductor chip 200 may be, but is not limited to, an application processor (AP), such as a CPU (Central Processing Unit), a GPU (Graphic Processing Unit), an FPGA (Field-Programmable Gate Array), a digital signal processor, an encryption processor, a micro processor, and a micro controller. For example, the first semiconductor chip 200 may be a logic chip such as an ADC (Analog-Digital Converter) or an ASIC (Application-Specific IC), and may be a memory chip such as a volatile memory (e.g., a DRAM) or a non-volatile memory (e.g., a ROM or a flash memory). It goes without say that the first semiconductor chip 200 may be formed by combining these elements with each other.

Although only one first semiconductor chip 200 is shown as being formed on the first wiring structure 100, this is merely for convenience of explanation. For example, a plurality of first semiconductor chips 200 may be formed side by side on the first wiring structure 100, or a plurality of first semiconductor chips 200 may be connected to each other by a conductive medium and be sequentially stacked on the first wiring structure 100.

In some example embodiments, the first semiconductor chip 200 may be mounted on the first wiring structure 100 by a flip chip bonding method. For example, a connecting pad 220 may be formed between one surface 100_1 (e.g., a first surface, upper surface, etc.) of the first wiring structure 100 and the lower surface 200_2 of the first semiconductor chip 200. The connecting pad 220 may electrically connect the first wiring structure 100 and the first semiconductor chip 200.

A passivation film 210 may be interposed between the plurality of connecting pads 220. The passivation film 210 may expose the connecting pad 220 on the other surface 200_2 of the first semiconductor chip 200. The passivation film 210 may be an oxide film, a nitride film, or a double layer of an oxide film and a nitride film.

The second wiring structure 300 may be placed on the first wiring structure 100 and the first semiconductor chip 200. The second wiring structure 300 may be spaced apart from (e.g., isolated from direct contact with) the first wiring structure 100. Further, the second wiring structure 300 may be spaced apart from (e.g., isolated from direct contact with) the first semiconductor chip 200.

The second wiring structure 300 may include one surface 300_1 and the other surface 300_1 that are opposite to each other. For example, one surface 300_1 of the second wiring structure 300 may face one surface 100_1 of the first wiring structure 100 and come into contact with (e.g., may directly contact) one surface 200_1 of the first semiconductor chip 200. One surface 300_1 of the second wiring structure 300 may be placed on the same surface as one surface 200_1 of the first semiconductor chip 200. A second semiconductor chip 700, which will be described later, may be placed on the other surface 300_2 of the second wiring structure 300.

The second wiring structure 300 includes a second insulating layer 310 and a second wiring pad 320. The second insulating layer 310 may include a second lower passivation film 313, a second substrate 311, and a second upper passivation film 312. The second lower passivation film 313 of the second insulating layer 310 may come into contact with (e.g., may directly contact) one surface 200_1 of the first semiconductor chip 200.

The second substrate 311 may be, for example, a printed circuit board (PCB) or a ceramic substrate. However, the technical idea of the present inventive concepts is not limited thereto. In some example embodiments, the second wiring structure 300 may include silicon (Si).

The second wiring pad 320 may include a second lower pad 323, a third wiring pattern 330, a second wiring pattern 321, and a second upper pad 322.

The second wiring pad 320 may be placed inside the second insulating layer 310. The second wiring pad 320 may include a second wiring pattern 321 for electrically connecting the second lower pad 323, the third wiring pattern 330 and the second upper pad 322. For example, the second upper pad 322 may be electrically connected to the second lower pad 323 and the third wiring pattern 330 by being connected to the second wiring pattern 321.

The second lower pad 323 may come into contact with (e.g., may directly contact) a connecting member 400 to be described later. The third wiring pattern 330 may come into contact with (e.g., may directly contact) one surface 200_1 of the first semiconductor chip 200. That is, the second lower pad 323 comes into contact with (e.g., may directly contact) the connecting member 400 and may not come into contact with (e.g., may be isolated from direct contact with) the first semiconductor chip 200. The third wiring pattern 330 comes into contact with (e.g., may directly contact) the first semiconductor chip 200, and may not come into contact with (e.g., may be isolated from direct contact with) the connecting member 400.

The plurality of third wiring pattern 330 may be formed to be spaced apart from each other (e.g., isolated from direct contact with each other). In some example embodiments, the second lower passivation film 313 of the second insulating layer 310 may be placed between the third wiring patterns 330 spaced apart from each other (e.g., isolated from direct contact with each other).

The second wiring pad 320 may include, but is not limited to, at least one of copper (Cu), aluminum (Al), silver (Ag), tin (Sn), gold (Au), nickel (Ni), lead (Pb), titanium (Ti), and alloys thereof.

Although the four second insulating layers 310 are shown, this is only for convenience of explanation. For example, it goes without saying that the second insulating layer 310 may be made up of multiple layers more than four layers to form the second wiring pad 320 of multiple layers.

The second upper passivation film 312 and the second upper pad 322 may be formed on the upper surface of the second substrate 311. The second upper passivation film 312 may cover the upper surface of the second substrate 311 and expose the second upper pad 322.

The second lower passivation film 313 and the second lower pad 323 may be formed on the lower surface of the second substrate 311. The second lower passivation film 313 may cover the lower surface of the second substrate 311 and expose the second lower pad 323.

The surface of the second substrate 311 may be covered with a solder resist. That is, the second upper passivation film 312 and the second lower passivation film 313 formed on the surface of the second substrate 311 may be solder resists. The second upper passivation film 312 and the second lower passivation film 313 may include, but are not limited to, for example, a photoimageable dielectric (PID) or ABF.

The connecting member 400 may be placed between the first wiring structure 100 and the second wiring structure 300.

The connecting member 400 may come into contact with (e.g., may directly contact) each of the upper surface 100_1 of the first wiring structure 100 and the lower surface 300_1 of the second wiring structure 300. The connecting member 400 may electrically connect the first wiring structure 100 and the second wiring structure 300. For example, the connecting member 400 may come into contact with (e.g., may directly contact) the first upper pad 122 of the first wiring structure 100 and the second lower pad 323 of the second wiring structure 300. As a result, the connecting member 400 may electrically connect the first wiring pad 120 and the second wiring pad 320.

The connecting member 400 may include a first connecting member 410 formed between the outer peripheral surface of the semiconductor package 1000 and the first semiconductor chip 200, and a second connecting member 420 formed between the plurality of first semiconductor chips 200. In some example embodiments, the first connecting member 410 is formed in the outer region of the first wiring structure 100, and may electrically connect the first wiring structure 100 and the second wiring structure 300.

The connecting member 400 may have, for example, but is not limited to, a spherical shape or an elliptical spherical shape. The connecting member 400 may include a conductive substance.

For example, the connecting member 400 may be a core ball (Cu core ball). In some example embodiments, the connecting member 400 may include a first layer 431, and a second layer 432 that surrounds the first layer 431. The first layer 431 may include copper (Cu), and the second layer 432 may include tin (Sn). However, the technical idea of the present inventive concepts is not limited thereto. For example, the connecting member 400 may include other conductive substances such as gold (Au) or nickel (Ni).

In some example embodiments, in another example, the connecting member 400 may include an insulating substance. For example, the connecting member 400 may include a polymeric material such as epoxy. In some example embodiments, the first layer 431 may include a conductive substance, and the second layer 432 may include an insulating substance. However, the technical idea of the present inventive concepts is not limited thereto.

The first upper pad 122 may come into contact with (e.g., may directly contact) the first layer 431 and may not come into contact with (e.g., may be isolated from direct contact with) the second layer 432. The second lower pad 323 may come into contact with (e.g., may directly contact) each of the first layer 431 and the second layer 432. However, the technical idea of the present inventive concepts is not limited thereto.

The first mold layer 500 may be formed on the first wiring structure 100. The first mold layer 500 may fill the space between the first wiring structure 100 and the second wiring structure 300. Accordingly, the first mold layer 500 may cover the first wiring structure 100, the first semiconductor chip 200, and the connecting member 400. The connecting member 400 may penetrate the first mold layer 500 to electrically connect the first wiring structure 100 and the second wiring structure 300.

In some example embodiments, one surface 200_1 of the first semiconductor chip 200 may not come into contact with (e.g., may be isolated from direct contact with) the first mold layer 500. The upper surface of the connecting member 400 may not come into contact with (e.g., may be isolated from direct contact with) the first mold layer 500.

The first mold layer 500 may include an insulating polymer material such as EMC (epoxy molding compound). The first mold layer 500 may include a thermosetting resin such as an epoxy resin, a thermoplastic resin such as polyimide, or a resin in which a reinforcing material such as a filler is included in these elements, for example, ABF, FR-4, BT resin, and the like.

The filler may utilize at least one or more selected from a group including silica ($SiO_2$), alumina ($Al_2O_3$), silicon carbide (SiC), barium sulfate ($BaSO_4$), talc, mud, mica powder, aluminum hydroxide ($Al(OH)_3$), magnesium hydroxide ($Mg(OH)_2$), calcium carbonate ($CaCO_3$), magnesium carbonate ($MgCO_3$), magnesium oxide (MgO), boron nitride (BN), aluminum borate ($AlBO_3$), barium titanate ($BaTiO_3$), and calcium zirconate ($CaZrO_3$). However, the material of the filler is not limited thereto, and may include a metal substance and/or an organic substance.

The semiconductor package 1000 according to some example embodiments further includes a second semiconductor package 1000B including a second semiconductor chip 700 and a second mold layer 800 on the first semiconductor package 1000A.

The second semiconductor chip 700 may be placed on the second wiring structure 300. The second semiconductor chip 700 may be placed on the other surface 300_2 of the second wiring structure 300. The second semiconductor chip 700 may be electrically connected to the second wiring structure 300. Although not specifically shown, the second semiconductor chip 700 is connected to the second upper pad 322 of the second wiring structure 300 and may be electrically connected to the second wiring structure 300.

For example, the second semiconductor chip 700 may include an integrated circuit IC in which hundreds to millions or more of semiconductor elements are integrated in a single chip.

In some example embodiments, the first semiconductor chip 200 may be a logic chip such as an application processor (AP), and the second semiconductor chip 700 may be a memory chip such as a volatile memory (e.g., a DRAM) or a non-volatile memory (e.g., a ROM or a flash memory).

Although only one second semiconductor chip 700 is shown as being formed on the second wiring structure 300, this is only for convenience of explanation. For example, a plurality of second semiconductor chips 700 may be formed side by side on the second wiring structure 300, or a plurality of second semiconductor chips 700 may be sequentially stacked on the second wiring structure 300.

In some example embodiments, the second semiconductor chip 700 may be mounted on the second wiring structure 300 by a flip chip bonding method. For example, a bump 710 may be formed between the upper surface of the second wiring structure 300 and the lower surface of the second semiconductor chip 700. The bump 710 may electrically connect the second wiring structure 300 and the second semiconductor chip 700.

The bump 710 may include, for example, a pillar layer 711 and a solder layer 712.

The pillar layer 711 may protrude from the lower surface of the second semiconductor chip 700. The pillar layer 711 may include, for example, but is not limited to, copper (Cu), copper alloy, nickel (Ni), palladium (Pd), platinum (Pt), gold (Au), cobalt (Co), and combinations thereof.

The solder layer 712 may connect the pillar layer 711 and the second wiring structure 300. Although not specifically shown, for example, the solder layer 712 may be electrically connected to a part of the second upper pads 322. The solder layer 712 may have, for example, but is not limited to, a spherical shape or elliptical spherical shape. The solder layer 712 may include, for example, but is not limited to, tin (Sn), indium (In), bismuth (Bi), antimony (Sb), copper (Cu), silver (Ag), zinc (Zn), lead (Pb), and combinations thereof.

In some example embodiments, the second mold layer 800 may be formed on the second wiring structure 300. The second mold layer 800 may cover and protect the second wiring structure 300, the second semiconductor chip 700, and the bump 710. The second mold layer 800 may include, but is not limited to, an insulating polymer material such as an EMC.

Hereinafter, a semiconductor package according to some other embodiments of the present inventive concepts will be described referring to FIG. 6. For convenience of explanation, differences from the semiconductor packages shown in FIGS. 1 to 5 will be mainly described.

Figure 6:
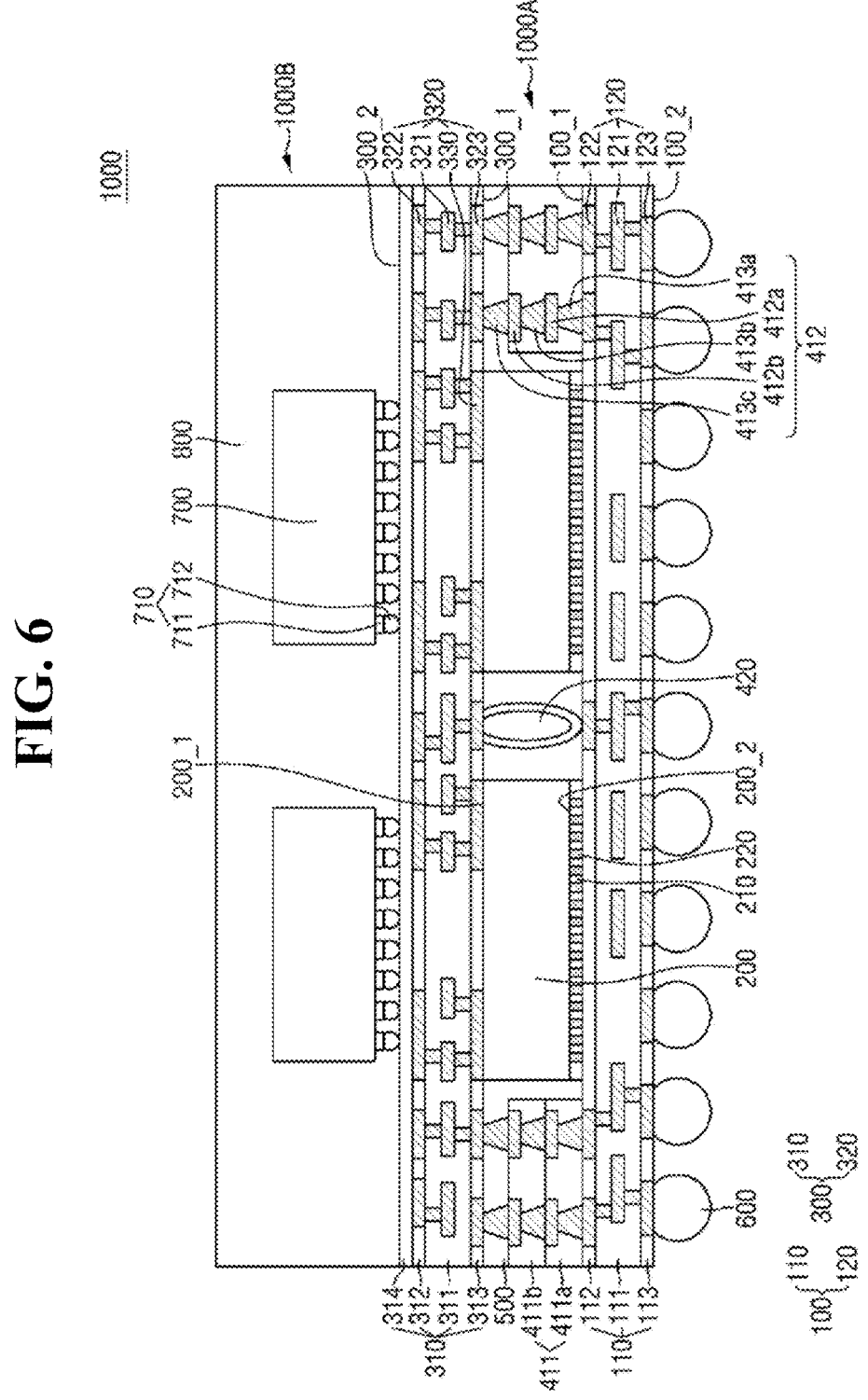
FIG. 6 is a schematic cross-sectional view of a semiconductor package according to some example embodiments taken along I-I' of FIG. 4.

FIG. 6 is a schematic cross-sectional view of a semiconductor package according to some example embodiments taken along I-I' of FIG. 4.

Referring to FIG. 6, the first connecting member 410 may include a wiring structure having first and second connecting pads 412a and 412b and first to third connecting vias 413a, 413b and 413c.

The first connecting member 400 may include a first interlayer insulating layer 411a that is in contact with (e.g., directly contacts) the upper surface 100_1 of the first wiring structure 100, and a first connecting via 413a and a first connecting pad 412a that are in contact with (e.g., directly contact) the upper surface 100_1 of the first wiring structure 100 and buried in the first interlayer insulating layer 411a. The first connecting via 413a may penetrate the first interlayer insulating layer 411a to electrically connect the first connecting pad 412a and the first wiring structure 100.

The first connecting member 400 may include a second interlayer insulating layer 411b placed on the first interlayer insulating layer 411a, and a second connecting via 413b and a second connecting pad 412b buried in the second interlayer insulating layer 411b. The second connecting via 413b may penetrate the second interlayer insulating layer 411b to electrically connect the second connecting pad 412b and the first connecting pad 412a.

The first connecting member 400 may include a third connecting via 413c buried in the first mold layer 500. The third connecting via 413c may penetrate at least a part of the first mold layer 500 to electrically connect the second connecting pad 412b and the second wiring structure 300.

As the materials of the first and second interlayer insulating layers 411a and 411b, an insulating substance may be used. At this time, as the insulating substance, a thermosetting resin such as an epoxy resin, a thermoplastic resin such as polyimide, or an insulating substance in which these resins are impregnated in an inorganic filler and/or a core material such as a glass fiber (Glass Cross, Glass Fabric), for example, Prepreg, ABF (Ajinomoto Build-up Film), FR-4, and BT (Bismaleimide Triazine), and the like may be used.

The first and second connecting pads 412a and 412b may serve to provide pad patterns for the first to third connecting vias 413a, 413b and 413c for connecting the upper portion and the lower portion of the first semiconductor package 1000A.

Metal substances such as copper (Cu), aluminum (Al), silver (Ag), tin (Sn), gold (Au), nickel (Ni), lead (Pb), titanium (Ti), or alloys thereof may be used as the substances of the first and second connecting pads 412a and 412b. The first and second connecting pads 412a and 412b may perform various functions depending on the design of that layer.

The first to third connecting vias 413a, 413b, and 413c electrically connect the first and second connecting pads 412a and 412b formed on different layers, and form provide an electrical path inside the first connecting member 410 accordingly.

As the material of the first and to third connecting vias 413a, 413b and 413c, a metal substance may be used. Each of the first to third connecting vias 413a, 413b and 413c may be a field via that is completely filled with a metal substance, or may be a conformal via in which the metal substance is formed along wall surfaces of the via hole. Further, each of the connecting vias may have a tapered shape. In some example embodiments, the first to third connecting vias 413a, 413b and 413c may be integrated with at least a part of the first and second connecting pads 412a and 412b, but are not limited thereto.

FIGS. 7, 8, 9, 10, 11, and 12 are diagrams for explaining a method of fabricating a semiconductor package according to some example embodiments of the present inventive concepts. FIG. 13 is a flowchart for explaining the method of fabricating the semiconductor package according to some example embodiments. For convenience of explanation, repeated parts of contents explained using FIGS. 1 to 5 will be briefly described or omitted.

Figure 7:
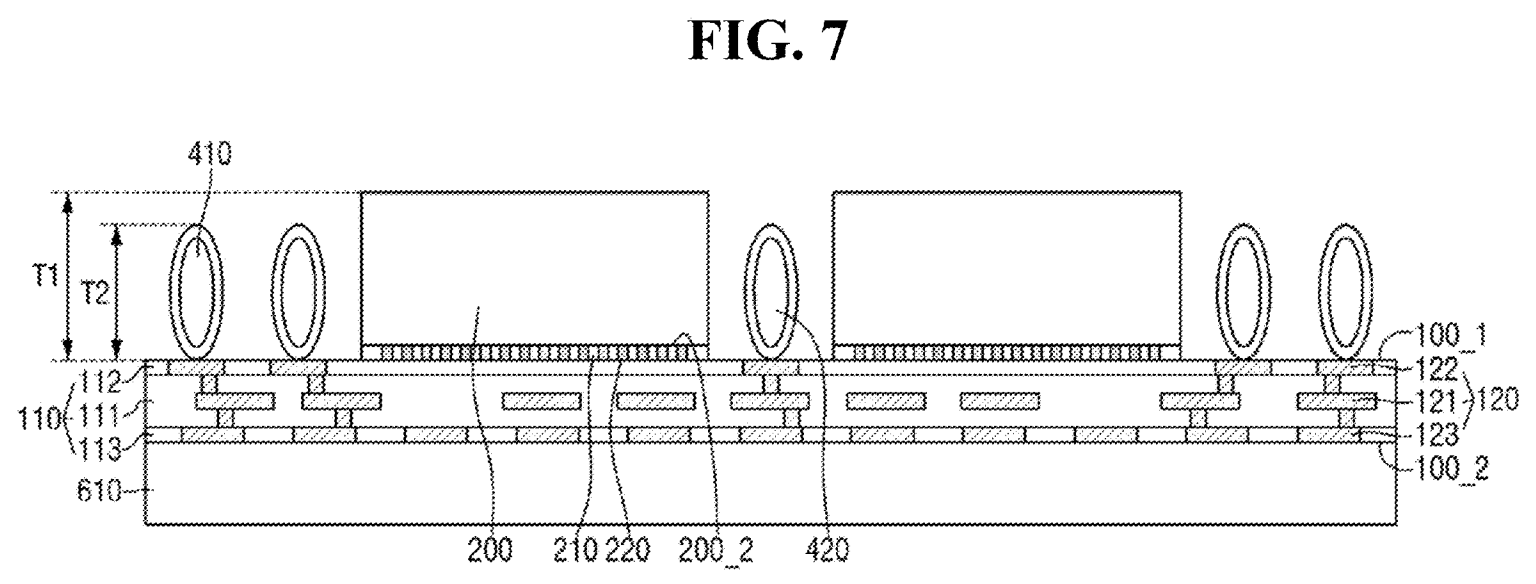

Referring to FIGS. 7 and 13 together, the first wiring structure 100 including the first insulating layer 110 and the first wiring pad 120 in the first insulating layer 110 is formed (S1). After that, the first semiconductor chip 200 and the connecting member 400 are formed on the first wiring structure 100. The first wiring structure 100 may be formed on a basis body 610.

For example, the basis body 610 may be a heat-treated curable adhesive tape. In some example embodiments, as another example, the basis body 610 may include a CCL (Copper Clad Laminate), a PPG, an ABF (Ajinomoto Build-up Film), epoxy, polyimide, or the like on which an adhesive is formed on one surface.

In some example embodiments, the first semiconductor chip 200 having a first thickness T1 may be formed on the first wiring structure 100 (S2). Further, a connecting member 400 having a second thickness T2 lower than the first thickness T1 may be formed on the first wiring structure 100 to be spaced apart from (e.g., isolated from direct contact with) the first semiconductor chip 200 (S3).

In some example embodiments, the thickness T1 of the first semiconductor chip 200 may mean a distance between one surface 100_1 of the first wiring structure 100 and one surface 200_1 of the first semiconductor chip 200. The thickness T2 of the connecting member 400 may mean a distance between one surface 100_1 of the first wiring structure 100 and the uppermost surface of the connecting member 400.

Figure 8:
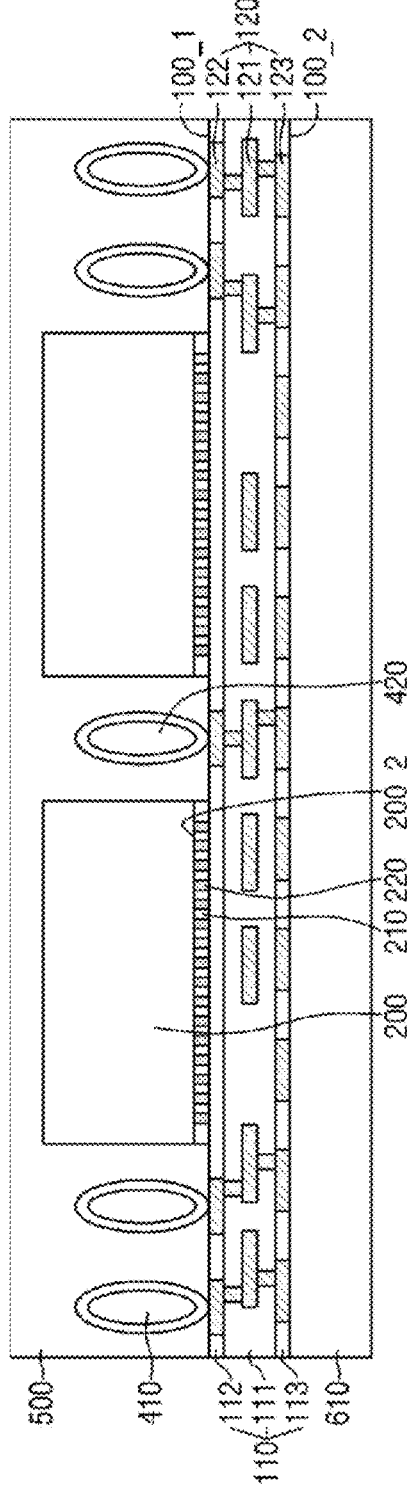

Referring to FIG. 8, after (e.g., subsequent to) forming the connecting member 400, the first mold layer 500 that covers the first semiconductor chip 200 and the connecting member 400 is formed. As in FIG. 7, by forming the connecting member 400 having the second thickness T2 lower than the first thickness T1 of the first semiconductor chip 200, the first mold layer 500 may be more easily filled in a region between the first semiconductor chip 200 and the connecting member 400 and/or a region between the connecting members 400.

Figure 9:
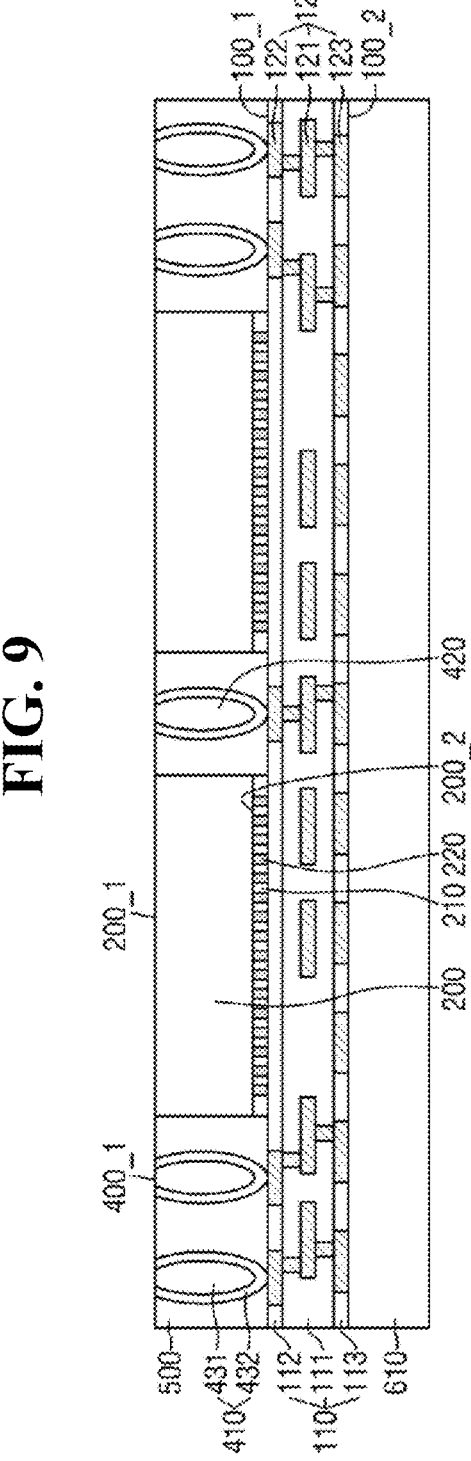

Referring to FIGS. 9 and 13 together, at least a part of the first semiconductor chip 200 and the connecting member 400 is removed to expose one surface 200_1 of the first semiconductor chip 200 and the upper surface 400_1 of the connecting member 400 (S4). In some example embodiments, both the first layer 431 and the second layer 432 may be exposed on the upper surface 400_1 of the connecting member 400.

For example, removal of at least a part of the first semiconductor chip 200 and the connecting member 400 may include grinding of each of the upper surfaces of the first semiconductor chip 200 and the connecting member 400. As a result, one surface 200_1 of the first semiconductor chip 200 and the upper surface 400_1 of the connecting member 400 may be placed on the same plane.

In some example embodiments, as one surface 200_1 of the first semiconductor chip 200 is exposed, the silicon layer included in the first semiconductor chip 200 may be exposed. In some example embodiments, the silicon layer may come into direct contact with (e.g., may directly contact) the third wiring pattern 330 and the second lower passivation film 313.

Exposal of one surface 200_1 of the first semiconductor chip 200 and the upper surface 400_1 of the connecting member 400 may include removal of at least a part of the first mold layer 500.

Accordingly, the thickness of the first semiconductor chip 200 and the thickness of the connecting member 400 may be formed to be equal to each other. Furthermore, the thickness of the first mold layer 500, the thickness of the first semiconductor chip 200, and the thickness of the connecting member 400 may be formed to be equal to each other. However, the technical idea of the present inventive concepts is not limited thereto.

Figure 10:
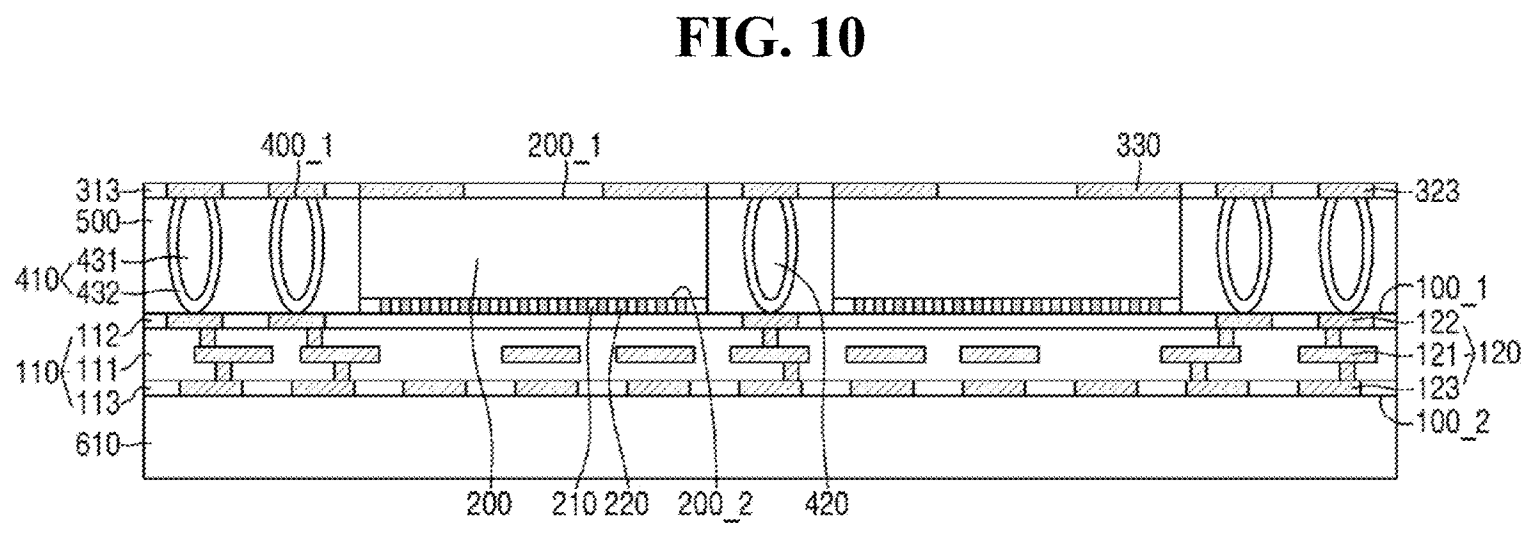

Referring to FIGS. 10 and 13 together, the second wiring structure 300, which includes the second lower passivation film 313 and the third wiring pattern 330 in the second lower passivation film 313 which each come into contact with (e.g., directly contact) one surface 200_1 of the first semiconductor chip 200, is formed on the first semiconductor chip 200 (S5). As a result, the second wiring structure 300 may be formed on the first semiconductor chip 200 such that the second wiring structure 300 comes into direct contact with (e.g., directly contacts) the first semiconductor chip 200.

In some example embodiments, as will be described later, the third wiring pattern 330 may play role of releasing heat generated in the first semiconductor chip 200, and may not play role of electrically connecting the first semiconductor chip 200 and the second wiring structure 300.

First, the second lower passivation film 313 that integrally covers one surface 200_1 of the first semiconductor chip 200 and the upper surface of the connecting member 400 may be formed on the first semiconductor chip 200 and the connecting member 400. After that, by exposing/developing the second lower passivation film 313, the second lower passivation film 313 may be patterned. After that, the third wiring pattern 330 may be formed between the second lower passivation films 313.

However, the technical idea of the present inventive concepts is not limited thereto. After the third wiring pattern 330 that integrally covers one surface 200_1 of the first semiconductor chip 200 and the upper surface 400_1 of the connecting member 400 is formed on the first semiconductor chip 200 and the connecting member 400, the third wiring pattern 330 and the second lower pad 323 may be patterned. After that, the second lower passivation film 313 may be formed between the third wiring patterns 330.

The second lower passivation film 313 may include a photoimageable dielectric (PID) or ABF. However, the technical idea of the present inventive concepts is not limited thereto.

In some example embodiments, the third wiring pattern 330 may be formed at the same level as the second lower pad 323. That is, the third wiring pattern 330 may be formed by the same process as the second lower pad 323.

The second lower pad 323 may come into contact with (e.g., may directly contact) the connecting member 400. The third wiring pattern 330 may come into contact with (e.g., may directly contact) one surface 200_1 of the first semiconductor chip 200. That is, the second lower pad 323 may come into contact with (e.g., may directly contact) the connecting member 400, and may not come into contact with (e.g., may be isolated from direct contact with) the first semiconductor chip 200. The third wiring pattern 330 may come into contact with (e.g., may directly contact) the first semiconductor chip 200, and may not come into contact with (e.g., may be isolated from direct contact with) the connecting member 400.

In some example embodiments, the first upper pad 122 may come into contact with (e.g., may directly contact) the first layer 431, and may not come into contact with (e.g., may be isolated from direct contact with) the second layer 432. The second lower pad 323 may come into contact with (e.g., may directly contact) each of the first layer 431 and the second layer 432.

In some example embodiments, by forming the third wiring pattern 330 of the second wiring structure 300 on the first semiconductor chip 200 to come into contact with (e.g., directly contact) the first semiconductor chip 200, heat generated in the first semiconductor chip 200 can be more efficiently released to the second wiring structure 300.

Further, by minimizing the distance between the first semiconductor chip 200 and the second wiring structure 300, the thickness of the semiconductor package 1000 can be reduced. As a result, a semiconductor package having a light weight and a small size can be fabricated.

Figure 11:
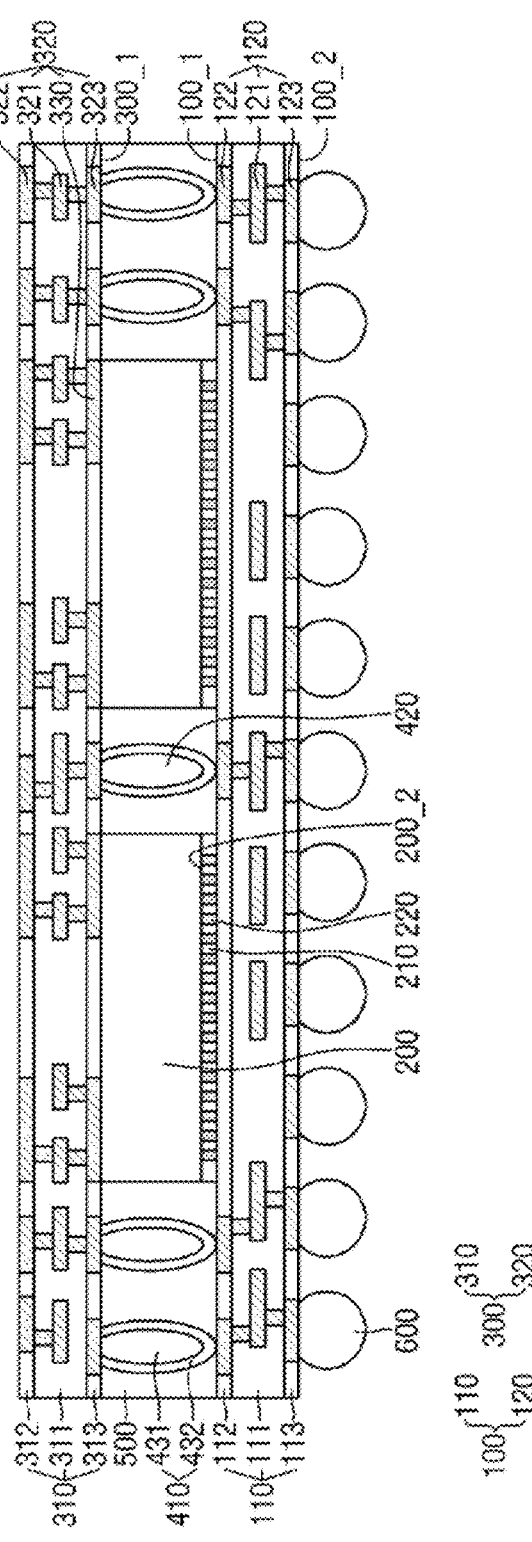

Referring to FIG. 11, the second substrate 311 and the second upper passivation film 312 are formed on the second lower passivation film 313 to form the second insulating layer 310. The second wiring pad 320 including the second wiring pattern 321 and the second upper pad 322 is formed inside the second insulating layer 310.

Figure 12:
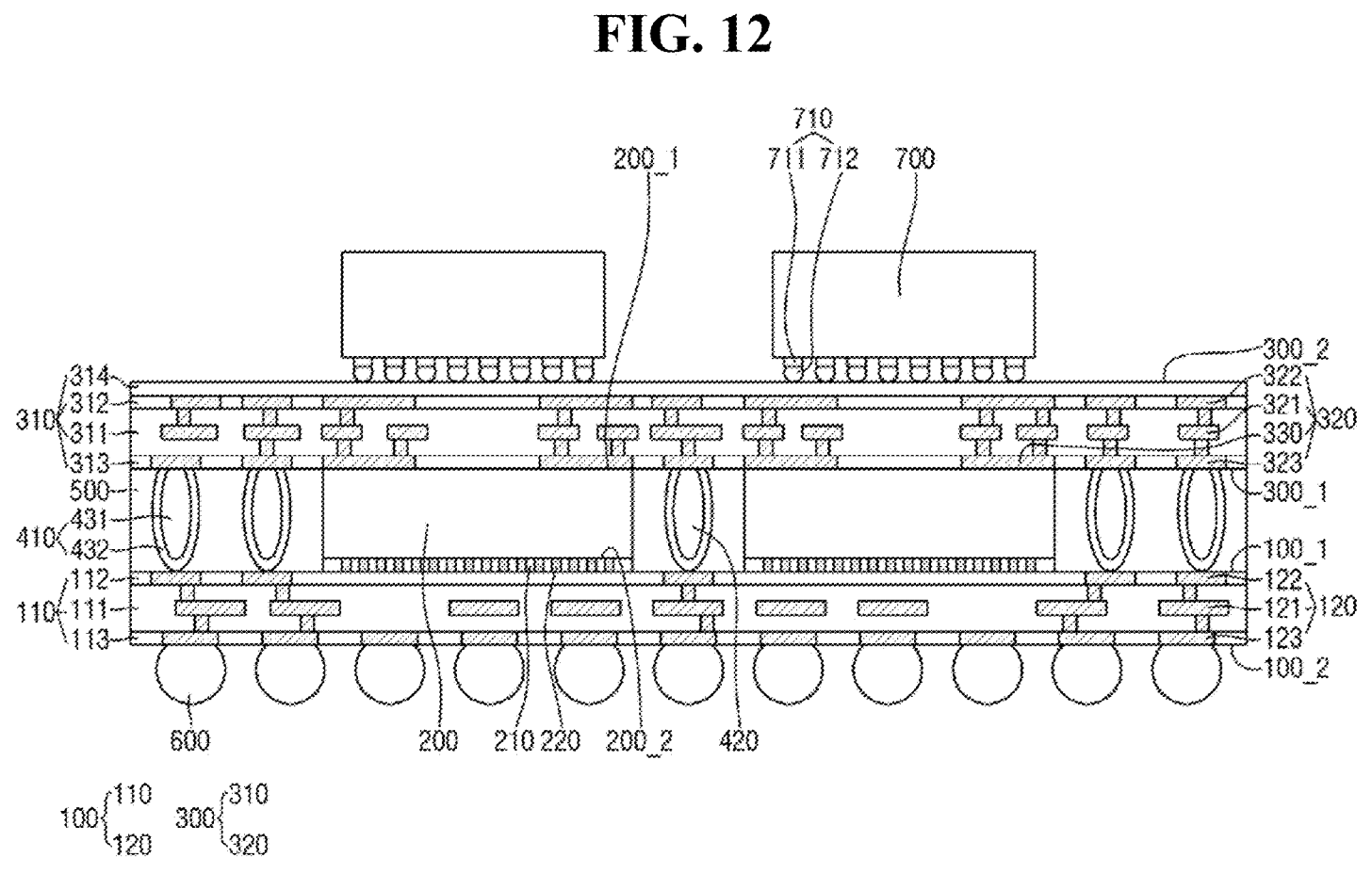

Referring to FIG. 12, the second semiconductor chip 700 is formed on the second wiring structure 300. For example, the second semiconductor chip 700 may be formed on the insulating layer 314 on the second wiring structure 300. Although not specifically shown, the second wiring structure 300 and the second semiconductor chip 700 may be electrically connected by the wiring pad inside the insulating layer 314.

The insulating layer 314 may include, for example, a photoimageable dielectric (PID). However, the technical idea of the present inventive concepts is not limited thereto.

For example, when the basis body 610 is a heat-treated curable adhesive tape, the basis body 610 may be heat-treated to weaken the adhesive force and then peeled off For example, when the basis body 610 is an ultraviolet curable adhesive tape, the basis body 610 may be irradiated with ultraviolet rays to weaken the adhesive force and then peeled off.

Referring to FIGS. 5 and 12 together, the semiconductor package 1000 may be formed, by forming the second mold layer 800 that covers the second semiconductor chip 700 and forming the connecting structure 600.

As described herein, any devices, systems, blocks, modules, units, controllers, circuits, apparatus, and/or portions thereof according to any of some example embodiments (including, without limitation, any of the example embodiments of electronic device 1, host 10, interface 11, main board 30, camera module 40, semiconductor package 1000, or the like) may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a micro-computer, a field programmable gate array (FPGA), and programmable logic unit, a microprocessor, application-specific integrated circuit (ASIC), a neural network process-ing unit (NPU), an Electronic Control Unit (ECU), an Image Signal Processor (ISP), and the like. In some example embodiments, the processing circuitry may include a non-transitory computer readable storage device (e.g., a memory), for example a solid state drive (SSD), storing a program of instructions, and a processor (e.g., CPU) con-figured to execute the program of instructions to implement the functionality and/or methods performed by some or all of any devices, systems, blocks, modules, units, controllers, circuits, apparatuses, and/or portions thereof according to any of some example embodiments, and/or any portions thereof, including for example some or all operations of any of the methods shown in FIGS. 6 to 13, or any combination thereof.

In concluding the detailed description, those skilled in the art will appreciate that many variations and modifications may be made to some example embodiments as described with reference to FIGS. 1 to 13 without substantially depart-ing from the principles of the present inventive concepts. Therefore, some example embodiments of the inventive concepts are used in a generic and descriptive sense only and not for purposes of limitation.

What is claimed is:

1. A semiconductor package, comprising:
a first wiring structure, wherein the first wiring structure includes a first insulating layer and a first wiring pad inside the first insulating layer;
a first semiconductor chip on the first wiring structure;
a second wiring structure on the first semiconductor chip, wherein the second wiring structure includes a second insulating layer and a plurality of second wiring pads in the second insulating layer, wherein the second insu-lating layer and the plurality of second wiring pads each directly contact one surface of the first semicon-ductor chip; and
a connecting member between the first wiring structure and the second wiring structure.

2. The semiconductor package of claim 1, wherein the plurality of second wiring pads are on the first semiconduc-tor chip and are isolated from direct contact with each other in the second insulating layer.

3. The semiconductor package of claim 1, wherein the second wiring structure further includes a third wiring pad that is in the second insulating layer and directly contacts the connecting member.

4. The semiconductor package of claim 1, wherein an upper surface of the connecting member is on a same plane as the one surface of the first semiconductor chip.

5. The semiconductor package of claim 1, wherein the connecting member includes a conductive substance which includes a first layer, and a second layer that surrounds the first layer.

6. The semiconductor package of claim 5, wherein the first wiring pad directly contacts the first layer and is isolated from direct contact with the second layer.

7. The semiconductor package of claim 1, wherein the connecting member includes an insulating substance.

8. The semiconductor package of claim 1, comprising:
a first mold layer which covers the first semiconductor chip and the connecting member.

9. The semiconductor package of claim 8, wherein the one surface of the first semiconductor chip is isolated from direct contact with the first mold layer.

10. The semiconductor package of claim 1, further com-prising:
a second semiconductor chip placed on the second wiring structure; and
a second mold layer which covers the second semicon-ductor chip.

11. A semiconductor package, comprising:
a first wiring structure which includes a first insulating layer and a first wiring pad inside the first insulating layer;
a first semiconductor chip on the first wiring structure;
a second wiring structure which is placed on the first semiconductor chip, wherein the second wiring struc-ture includes a second insulating layer and a plurality of second wiring pads in the second insulating layer which each directly contact one surface of the first semicon-ductor chip;
a connecting member placed between the first wiring structure and the second wiring structure; and
a mold layer which covers the first semiconductor chip, wherein the one surface of the first semiconductor chip is isolated from direct contact with the mold layer.

12. The semiconductor package of claim 11, wherein the plurality of second wiring pads are on the first semiconduc-tor chip and are isolated from direct contact with each other in the second insulating layer.

13. The semiconductor package of claim 11, wherein the second wiring structure further includes a third wiring pad which is in the second insulating layer and directly contacts the connecting member.

14. The semiconductor package of claim 11, wherein an upper surface of the connecting member is on a same plane as the one surface of the first semiconductor chip.

15. The semiconductor package of claim 11, wherein the connecting member includes a first layer and a second layer which surrounds the first layer.

16. A method of fabricating a semiconductor package, the method comprising:
forming a first wiring structure, the first wiring structure including a first insulating layer and a first wiring pad inside the first insulating layer;
forming a first semiconductor chip having a first thickness on the first wiring structure;
forming a connecting member having a second thickness lower than the first thickness on the first wiring struc-ture the first semiconductor chip;
removing at least a part of the first semiconductor chip and the connecting member to expose one surface of the first semiconductor chip and one surface of the connecting member; and
forming a second wiring structure on the first semicon-ductor chip, the second wiring structure including a second insulating layer and a plurality of second wiring pads inside the second insulating layer, the second insulating layer and the plurality of second wiring pads each directly contacting the one surface of the first semiconductor chip.

17. The method of fabricating the semiconductor package of claim 16, further comprising:
forming a first mold layer which covers the first semi-conductor chip and the connecting member, subsequent to forming the connecting member.

18. The method of fabricating the semiconductor package of claim 16, wherein the plurality of second wiring pads are on the first semiconductor chip and are isolated from direct contact with each other in the second insulating layer.

19. The method of fabricating the semiconductor package of claim 16, wherein the second wiring structure further includes a third wiring pad that is in the second insulating layer and directly contacts the connecting member.

20. The method of fabricating the semiconductor package of claim 16, wherein the one surface of the connecting member is placed on a same plane as the one surface of the first semiconductor chip.

* * * * *